(12) United States Patent
Zeng et al.

(10) Patent No.: US 10,584,222 B2
(45) Date of Patent: Mar. 10, 2020

(54) RESIN COMPOSITION AND PRE-PREG AND LAMINATE USING THE COMPOSITION

(71) Applicant: Shengyi Technology Co., Ltd., Guangdong (CN)

(72) Inventors: Xianping Zeng, Guangdong (CN); Guangbing Chen, Guangdong (CN); Chiji Guan, Guangdong (CN); Wenhua Yang, Guangdong (CN)

(73) Assignee: Shengyi Technology Co., Ltd., Guangdong (CN)

( * ) Notice: Subject to any disclaimer, the term of this patent is extended or adjusted under 35 U.S.C. 154(b) by 67 days.

(21) Appl. No.: 15/555,826

(22) PCT Filed: Sep. 18, 2015

(86) PCT No.: PCT/CN2015/089906
§ 371 (c)(1),
(2) Date: Sep. 5, 2017

(87) PCT Pub. No.: WO2016/138759
PCT Pub. Date: Sep. 9, 2016

(65) Prior Publication Data
US 2018/0037705 A1    Feb. 8, 2018

(30) Foreign Application Priority Data
Mar. 5, 2015 (CN) .......................... 2015 1 0098104

(51) Int. Cl.
| | | |
|---|---|---|
| C08J 5/24 | (2006.01) | |
| B32B 5/26 | (2006.01) | |
| B32B 15/08 | (2006.01) | |
| B32B 15/085 | (2006.01) | |
| B32B 15/20 | (2006.01) | |
| C08F 257/02 | (2006.01) | |
| H05K 1/03 | (2006.01) | |
| C08L 9/06 | (2006.01) | |
| B32B 15/14 | (2006.01) | |
| C08F 279/02 | (2006.01) | |
| B32B 7/04 | (2019.01) | |
| B32B 37/10 | (2006.01) | |
| C08L 71/12 | (2006.01) | |

(52) U.S. Cl.
CPC .................. *C08J 5/24* (2013.01); *B32B 5/26* (2013.01); *B32B 7/04* (2013.01); *B32B 15/08* (2013.01); *B32B 15/085* (2013.01); *B32B 15/14* (2013.01); *B32B 15/20* (2013.01); *B32B 37/1018* (2013.01); *C08F 257/02* (2013.01); *C08F 279/02* (2013.01); *C08L 9/06* (2013.01); *C08L 71/126* (2013.01); *H05K 1/0326* (2013.01); *H05K 1/0346* (2013.01); *H05K 1/0353* (2013.01); *B32B 2260/021* (2013.01); *B32B 2260/046* (2013.01); *B32B 2262/101* (2013.01); *B32B 2307/204* (2013.01); *B32B 2307/306* (2013.01); *B32B 2307/3065* (2013.01); *B32B 2307/732* (2013.01); *B32B 2457/08* (2013.01); *C08J 2371/12* (2013.01); *C08J 2435/06* (2013.01)

(58) Field of Classification Search
CPC .......................................................... C08J 5/24
USPC .......................................................... 428/523
See application file for complete search history.

(56) References Cited

U.S. PATENT DOCUMENTS

| | | | | |
|---|---|---|---|---|
| 2014/0024278 A1† | 1/2014 | He | | |
| 2014/0044918 A1† | 2/2014 | Zeng | | |
| 2014/0255711 A1* | 9/2014 | Chen et al. | ............ | C08L 71/12 |
| 2015/0044485 A1* | 2/2015 | Wang et al. | ............ | H05K 1/036 |

FOREIGN PATENT DOCUMENTS

| | | |
|---|---|---|
| CN | 101370866 A | 2/2009 |
| CN | 101643650 A | 2/2010 |
| CN | 102807658 | 12/2012 |
| CN | 104031377 A | 9/2014 |
| CN | 104093779 | 10/2014 |
| CN | 104341766 A | 2/2015 |
| CN | 104725857 A | 6/2015 |

(Continued)

OTHER PUBLICATIONS

International Search Report issued in PCT/CN2015/089906 dated Dec. 30, 2015.

*Primary Examiner* — Duc Truong
(74) *Attorney, Agent, or Firm* — Norton Rose Fulbright US LLP; James R. Crawford

(57) ABSTRACT

Provided in the present invention are a resin composition and a pre-preg and a laminate using the composition. The resin composition comprises: (A) a prepolymer of a polyolefin resin and a bifunctional maleimide or a multifunctional maleimide; and, (B) vinyl thermosetting polyphenylene ether, where with the weight of the prepolymer of the polyolefin resin and the bifunctional maleimide or the multifunctional maleimide being 100 parts by weight, the weight of the vinyl thermosetting polyphenylene ether is 200 to 1000 parts by weight. The present invention, by employing the prepolymer of the polyolefin resin and the bifunctional maleimide or the multifunctional maleimide, solves the problem of incompatibility of the bifunctional maleimide or the multifunctional maleimide with the polyolefin resin and vinyl thermosetting polyphenylene ether. An aqueous glue solution so mixed is uniform and consistent, the pre-preg has a uniform expression, and a substrate resin area is free of a phase-separation problem.

21 Claims, 1 Drawing Sheet

(56) References Cited

FOREIGN PATENT DOCUMENTS

| JP | S57185350 A | 11/1982 |
|----|-------------|---------|
| KR | 20080060540 A | 7/2008 |
| TW | 200904896 | 2/2009 |
| TW | 201431950 | 8/2014 |
| WO | 2013/110068 A1 | 7/2013 |

\* cited by examiner
† cited by third party

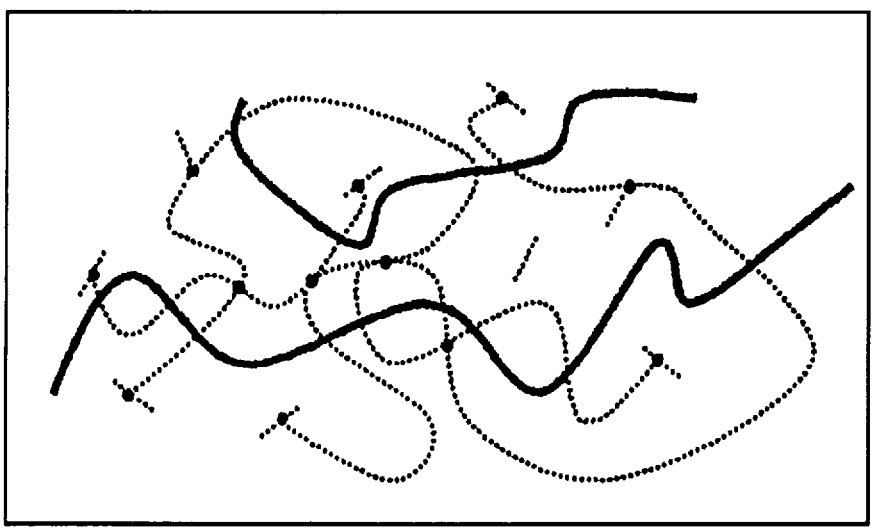

RESIN COMPOSITION AND PRE-PREG AND LAMINATE USING THE COMPOSITION

CROSS REFERENCE TO RELATED APPLICATIONS

This application is a § 371 of International Application No. PCT/CN2015/089906 filed Sep. 18, 2015, and claims priority from Chinese Patent Application No, 201510098104.5 filed Mar. 5, 2015.

TECHNICAL FIELD

The present invention belongs to the technical field of copper clad laminates and relates to a resin composition and a prepreg and a laminate using the composition.

BACKGROUND ART

In recent years, with the development of electronic information technology, electronic equipments have become miniaturization, high-density, and information trends to be large-capacity and high-speed, which put forward higher requirements for overall performance of circuit substrates including heat resistance, water absorption, chemical resistance, mechanical properties, dimensional stability, dielectric properties and others.

In terms of dielectric properties, the relationship between signal transmission rate and dielectric constant Dk of insulating material in high-speed circuit is that: the lower the dielectric constant Dk of insulating material is, the faster the signal transmission rate is. Therefore, to achieve high signal transmission rate, substrates having low dielectric constant must be developed. As the signal rate becoming high, the loss of signal in the substrate can no longer be ignored. The relationship among signal loss and rate, dielectric constant Dk and dielectric loss factor Df is that: the smaller the dielectric constant Dk of a substrate is, the smaller the dielectric loss factor Df is, and the smaller the signal loss is.

Therefore, the development of a high-speed circuit substrate having low dielectric constant Dk, low dielectric loss factor Df and good heat resistance becomes a research direction commonly focused by CCL manufacturers.

Polyphenylene ether resin contains a large number of benzene ring structures in its molecular structure, and no strong polar group, giving excellent performances to polyphenylene ether resin, such as high glass transition temperature, good dimensional stability, low linear expansion coefficient and low water absorption, especially excellent low dielectric constant and low dielectric loss, and thus is an ideal resin material for preparing high-speed circuit boards.

Butadiene-styrene copolymer does not contain polar groups, and has good dielectric properties, low water absorption, good flexibility. Butadiene-styrene copolymer contains reactive vinyl group and is commonly used as a crosslinking agent for high-speed electronic circuit substrate resin systems.

Maleimide has excellent heat resistance, flame resistance, mechanical properties and dimensional stability, and is usually used as a crosslinking agent for high-speed electronic circuit substrate resin systems.

CN103965606A discloses a low dielectric material comprising: 40 to 80 parts by weight of polyphenylene ether, 5 to 30 parts by weight of bismaleimide, and 5 to 30 parts by weight of a polymer additive. Wherein the structural formula of the polyphenylene ether is as follow:

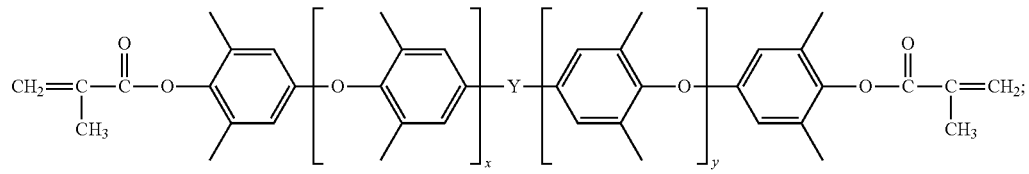

the polymer additive is selected from the group consisting of polybutadiene, styrene-butadiene copolymer, styrene-butadiene-divinylbenzene copolymer, styrene-maleic anhydride copolymer, maleic anhydride-grafted polybutadiene, and combinations thereof. Since styrene-butadiene copolymer, polybutadiene, styrene-butadiene copolymer-divinylbenzene copolymer and polyphenylene ether are incompatible with maleimide, there are problems in the mixing process that: glue liquid is layered, the surface of prepreg has turtle-like cracks, and substrate resin area has a phase separation.

CN101643650A discloses a phosphorus-containing flame retardant for use in an electronic circuit substrate. The phosphorus-containing flame retardant is added to resin systems having unsaturated double bonds, engineering plastics or polyolefin polymers, and plays roles of crosslinking and flame retardancy. Wherein, the resin having unsaturated double bonds includes homopolymers or copolymers of butadiene, styrene, isoprene, divinylbenzene, methylstyrene, acrylate, acrylonitrile, N-phenylmaleimide, N-vinylphenylmaleimide; vinyl substituted polyphenylene ethers; for example, a resin composition of a copolymer of butadiene, styrene and N-phenylmaleimide and a vinyl-substituted polyphenylene ether, or a resin composition of a copolymer of butadiene, styrene and N-vinylphenylmaleimide and a vinyl-substituted polyphenylene ether is used for preparing electronic circuit substrates. Since the used maleimide has a monomaleimide structure, the prepared substrate has lower heat resistance, higher thermal expansion coefficient, shorter thermal stratification time and lower thermal decomposition temperature, compared with a substrate prepared using maleimide having a bifunctional maleimide or polyfunctional maleimide structure.

CN101370866A discloses a resin composition which is a thermosetting resin composition of a semi-IPN type composite. Wherein, the resin composition is derived from a semi-cured resin composition formed by compatibilizing a prepolymer of butadiene polymer and a crosslinking agent with polyphenylene ether. Wherein, the butadiene polymer contains 40% or more of a 1,2-butadiene unit having a 1,2-vinyl group in a side chain in the molecule and is not chemically modified. In this invention, the polyphenylene ether is a thermoplastic high molecular polymer, and the molecular weight thereof is preferably 7,000-30,000. As can be seen from the examples, thermoplastic polyphenylene ether from Asahi Kasei Chemicals Corporation, Japan, in the tradename of S202A was used. Since the thermoplastic polyphenylene ether was incompatible with the butadiene polymer, the thermoplastic polyphenylene ether and the butadiene polymer were compatibilized in order to improve the compatibility between them. Since crosslinking reaction cannot occur between the thermoplastic polyphenylene ether and the butadiene polymer, a crosslinking agent (e.g. maleimide) is introduced to crosslink the butadiene polymer. Prepolymer of the butadiene polymer and the crosslinking agent was compatibilized with polyphenylene ether, and thus an uncured semi-IPN homogeneous composite thermosetting resin composition of polyphenylene ether-modified butadiene polymer was obtained. It is conceived that homogenization (compatibilization) in this case is not related to forming chemical bonds between polyphenylene ether and the other component (prepolymer of the butadiene polymer and the crosslinking agent), but is related to microphase separation resulting from physical mutual entanglement of molecular chains of polyphenylene ether and the other component (prepolymer of the butadiene polymer and the crosslinking agent). Therefore, it is conceived that the resin composition is apparently homogenized (compatibilized). The structure of the IPN type homogenous composite thermosetting resin composition has a structure as shown in the FIGURE.

Since this invention employs thermoplastic polyphenylene ether and butadiene polymer, there are problems as follows:
(1) Since the thermoplastic polyphenylene ether has a high molecular weight (the thermoplastic polyphenylene ether which is used in the examples and is the only one used is a thermoplastic polyphenylene oxide S202A from Asahi Kasei Chemicals Corporation, Japan and has a number average molecular weight of 16,000), the prepared glue has a high viscosity and the prepared prepreg has a poor appearance (with stripes, colloidal particles, dry flowers, bubbles);
(2) Since the used thermoplastic polyphenylene ether does not contain vinyl active functional group, it cannot be crosslinked and cured with butadiene polymer. Therefore, compared with the thermosetting modified polyphenylene ether comprising vinyl, the used thermoplastic polyphenylene ether has worse heat resistance, resulting in insufficient heat resistance of the prepared electronic circuit substrate, and thus the prepared PCB used for high multi-layer high-speed electronic circuit has a significant heat resistance problem that delamination will occur after several harsh lead-free reflow solderings.

WO2013/110068A1 discloses a resin composition comprising: from 30 to 80 wt % of a resin, a base resin prepolymer, and combinations thereof; from 1 to 30 wt % of at least one monomer of mono maleimide, bismaleimide or a combination of mono maleimide and bismaleimide monomers; a flame retardant; and an initiator. In this invention, the resin prepolymer refers to a prepolymer of polyolefin resin and maleimide resin. Polyolefin resin includes polybutadiene, styrene-butadiene copolymer, polyisoprene, styrene-butadiene-divinylbenzene copolymer. Maleimide includes mono maleimide, bismaleimide or a combination of mono maleimide and bismaleimide monomers. As can be seen from the description of this invention, the resin composition further comprises polyphenylene ether, of which the molecular chain end structure is phenylhydroxy, methacrylate or acrylate group. Polyphenylene ether may be present in an amount ranging from 10 to 50 wt %. Therefore, in the resin composition, the main resin is polyolefin, rather than polyphenylene ether, resulting in insufficient heat resistance of the prepared electronic circuit substrate, and thus the prepared PCB used for high multi-layer high-speed electronic circuit has a significant heat resistance problem that delamination will occur after several harsh lead-free reflow solderings.

BRIEF DESCRIPTION OF THE DRAWING

The FIGURE shows structure of the IPN type homogenous composite thermosetting resin composition.

CONTENTS OF THE INVENTION

In view of existing problems, one object of the present invention is to provide a resin composition which is capable of satisfying the requirements for overall performance such as dielectric properties and heat resistance for high-speed electronic circuit substrates.

In order to achieve the above purpose, the present invention employs the following technical solution.

A resin composition comprises:
(A) a prepolymer of polyolefin resin and bifunctional maleimide or polyfunctional maleimide; and
(B) a vinyl thermosetting polyphenylene ether.
Wherein, based on 100 parts by weight of the prepolymer of polyolefin resin and bifunctional maleimide or polyfunctional maleimide, the weight of the vinyl thermosetting polyphenylene ether is 200 to 1000 parts by weight, for example 250 parts by weight, 300 parts by weight, 350 parts by weight, 400 parts by weight, 450 parts by weight, 500 parts by weight, 550 parts by weight, 600 parts by weight, 650 parts by weight, 700 parts by weight, 750 parts by weight, 800 parts by weight, 850 parts by weight, 900 parts by weight, or 950 parts by weight.

When the vinyl thermosetting polyphenylene ether is used in an amount ranging from 200 to 1000 parts by weight based on 100 parts by weight of the prepolymer of polyolefin resin and bifunctional maleimide or polyfunctional maleimide, the prepared boards can achieve good heat resistance and dielectric properties.

In the above resin composition, the polyolefin resin is anyone selected from the group consisting of styrene-butadiene copolymer, polybutadiene or styrene-butadiene-divinylbenzene copolymer, or a mixture of at least two of them. Preferably, the polyolefin resin is anyone selected from the group consisting of amino-modified, maleic anhydride-modified, epoxy-modified, acrylate-modified, hydroxy-modified or carboxy-modified styrene-butadiene copolymer, polybutadiene, styrene-butadiene-divinylbenzene copolymer, or a mixture of at least two of them.

Examples of polyolefin resin are styrene-butadiene copolymer R100 from Samtomer, polybutadiene B-1000 from Nippon Soda, or styrene-butadiene-divinylbenzene copolymer R250 from Samtomer.

The weight of bifunctional maleimide or polyfunctional maleimide is 10 to 100 parts by weight, for example, 20 parts by weight, 30 parts by weight, 40 parts by weight, 50 parts by weight, 60 parts by weight, 70 parts by weight, 80 parts by weight, or 90 parts by weight, based on 100 parts by weight of polyolefin resin.

When the bifunctional maleimide or polyfunctional maleimide is used in an amount ranging from 10 to 100 parts by weight based on 100 parts by weight of polyolefin resin, it can realize that the prepared board has good crosslinking density and dielectric properties.

In the above resin composition, the bifunctional maleimide or polyfunctional maleimide has a structure as follow:

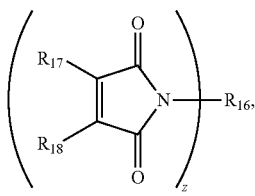

wherein $R_{16}$ is an aliphatic or aromatic organic group having a valence of z; $R_{17}$ and $R_{18}$ are each independently selected from any one of hydrogen atom, halogen atom, substituted or unsubstituted C1-C8 linear alkyl group, and substituted or unsubstituted C1-C8 branched alkyl group; z represents an integer greater than or equal to 2.

Exemplary bifunctional maleimide is a bifunctional maleimide from K-I Chemical having the following structural formula:

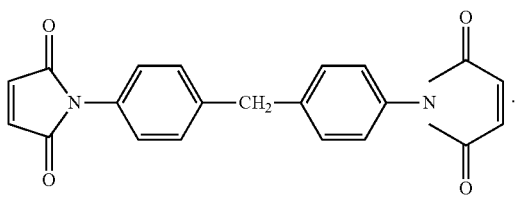

Exemplary polyfunctional maleimide is a polyfunctional maleimide from Jinyi Chemical having the following structural formula:

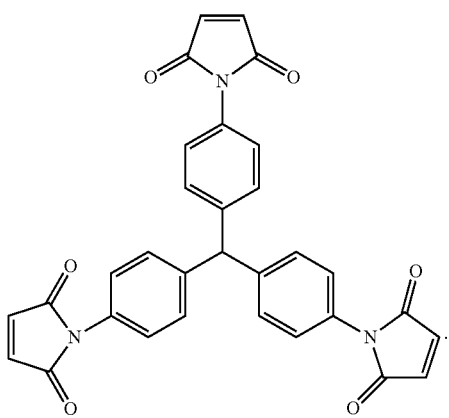 [SMILES: O=C1C=CC(=O)N1c1ccc(C(c2ccc(N3C(=O)C=CC3=O)cc2)c2ccc(N3C(=O)C=CC3=O)cc2)cc1]

In the above resin composition, the prepolymerization of the prepolymer of polyolefin resin and bifunctional maleimide or polyfunctional maleimide comprises the following steps:
(1) polyolefin resin is dissolved in a weakly polar solvent such as toluene or butanone, and bifunctional maleimide or polyfunctional maleimide is dissolved in a strongly polar solvent such as N,N-dimethylformamide or N-methylpyrrolidone;
(2) the polyolefin resin solution is mixed uniformly with the bifunctional maleimide or polyfunctional maleimide solution, then the mixture is heated to a set temperature, and a radical initiator is added, and then the mixture is prepolymerized at the set temperature for a certain period of time; the conversion ratio of bifunctional maleimide or polyfunctional maleimide is monitored by GPC, and is controlled in the range of 10-80%.

The radical initiator is selected from the group consisting of organic peroxide initiators, further preferably from any one of dilauroyl peroxide, dibenzoyl peroxide, cumyl peroxyneodecanoate, tert-butyl peroxyneodecanoate, tert-amyl peroxypivalate, tert-butyl peroxypivalate, tert-butyl peroxyisobutyrate, tert-butyl peroxy-3,5,5-trimethylhexanoate, tert-butyl peroxyacetate, tert-butyl peroxybenzoate, 1,1-di-(tert-butylperoxy)-3,5,5-trimethylcyclohexane, 1,1-di(tert-butylperoxy)cyclohexane, 2,2-di(tert-butylperoxy)butane, bis(4-tert-butylcyclohexyl)peroxydicarbonate, cetyl peroxydicarbonate, tetradecyl peroxydicarbonate, di-tert amyl peroxide, dicumyl peroxide, bis(tert-butylperoxyisopropyl)benzene, 2,5-dimethyl-2,5-di(tert-butylperoxy)hexane, 2,5-dimethyl-2,5-di(tert-butylperoxy)hexyne, diisopropylbenzene hydroperoxide, isopropylbenzene hydroperoxide, tert-amyl hydroperoxide, tert-butyl hydroperoxide, tert-butyl cumyl peroxide, diisopropylbenzene hydroperoxide, peroxy carbonate-tert-butyl 2-ethylhexanoate, tert-butyl peroxy 2-ethylhexyl carbonate, n-butyl 4,4-di(tert-butylperoxy)valerate, methyl ethyl ketone peroxide, cyclohexane peroxide, or a mixture of at least two of them.

In the resin composition, the vinyl thermosetting polyphenylene ether has a structural formula represented by the following formula (1):

$$Z-(-O-Y-)_a-(-O-X-O-)-(-Y-O-)_b-Z \quad (1).$$

In formula (1), a and b are independently an integer of 1 to 30, for example, 2, 5, 8, 11, 14, 17, 20, 23, 26 or 29, and Z has a structure of formula (2) or (3), —(O—Y—)— has a structure of formula (4), and —(—O—X—O—)— has a structure of formula (5).

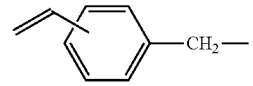

(2)

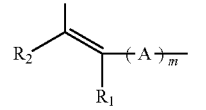

(3)

In formula (3), A is arylene group, carbonyl group, or alkylene group having 1 to 10 carbon atoms (e.g., 2, 3, 4, 5, 6, 7, 8 or 9); m is an integer of 0 to 10 (e.g., 1, 2, 3, 4, 5, 6, 7, 8 or 9); $R_1$, $R_2$ and $R_3$ are the same or different and are each independently hydrogen or alkyl group having 10 or less carbon atoms.

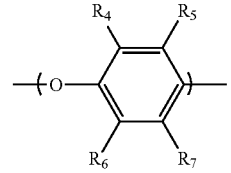

(4)

In formula (4), $R_4$ and $R_6$ are the same or different, and are each independently hydrogen atom, halogen atom, alkyl group having 8 or less carbon atoms or phenyl group having 8 or less carbon atoms; $R_5$ and $R_7$ are the same or different, and are each independently hydrogen atom, halogen atom, alkyl group having 8 or less carbon atoms or phenyl group having 8 or less carbon atoms.

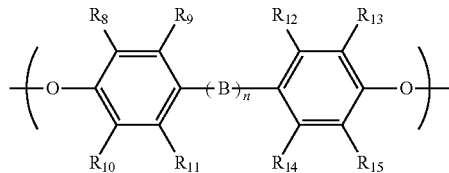

(5)

In formula (5), $R_8$, $R_9$, $R_{10}$, $R_{11}$, $R_{12}$, $R_{13}$, $R_{14}$ and $R_{15}$ are the same or different, and are each independently hydrogen atom, halogen atom, alkyl group having 8 or less carbon atoms or phenyl group having 8 or less carbon atoms; B is hydrocarbylene group, —O—, —CO—, —SO—, —SC—, —SO$_2$— or —C(CH$_3$)$_2$—; and n is 0 or 1.

Examples of vinyl thermosetting polyphenylene ether include methyl methacrylate-modified polyphenylene oxide MX9000 from Sabic, styryl-modified polyphenylene ether St-PPE-1 from Mitsubishi Chemical.

Preferably, the vinyl thermosetting polyphenylene ether has a number average molecular weight from 500 to 10,000 g/mol, preferably from 800 to 8,000 g/mol, and more preferably from 1,000 to 7,000 g/mol.

Preferably, the resin composition further comprises a component (C): an initiator. The initiator is a radical initiator. The radical initiator is selected from organic peroxide initiators, further preferably from any one of dilauroyl peroxide, dibenzoyl peroxide, cumyl peroxyneodecanoate, tert-butyl peroxyneodecanoate, tert-amyl peroxypivalate, tert-butyl peroxypivalate, tert-butyl peroxyisobutyrate, tert-butyl peroxy-3,5,5-trimethylhexanoate, tert-butyl peroxyacetate, tert-butyl peroxybenzoate, 1,1-di-(tert-butylperoxy)-3,5,5-trimethylcyclohexane, 1,1-di(tert-butylperoxy)cyclohexane, 2,2-di(tert-butylperoxy)butane, bis(4-tert-butylcyclohexyl)peroxydicarbonate, cetyl peroxydicarbonate, tetradecyl peroxydicarbonate, di-tert amyl peroxide, dicumyl peroxide, bis(tert-butylperoxyisopropyl)benzene, 2,5-dimethyl-2,5-di(tert-butylperoxy)hexane, 2,5-dimethyl-2,5-di(tert-butylperoxy)hexyne, diisopropylbenzene hydroperoxide, isopropylbenzene hydroperoxide, tert-amyl hydroperoxide, tert-butyl hydroperoxide, tert-butyl cumyl peroxide, diisopropylbenzene hydroperoxide, peroxy carbonate-tert-butyl 2-ethylhexanoate, tert-butyl peroxy 2-ethylhexyl carbonate, n-butyl 4,4-di(tert-butylperoxy)valerate, methyl ethyl ketone peroxide, cyclohexane peroxide, or a mixture of at least two of them.

The weight of the initiator is 1-3 parts by weight, for example, 1.2 parts by weight, 1.4 parts by weight, 1.6 parts by weight, 1.8 parts by weight, 2.0 parts by weight, 2.2 parts by weight, 2.4 parts by weight, 2.6 parts by weight or 2.8 parts by weight, based on 100 parts by weight of the total weight of the prepolymer of polyolefin resin and bifunctional maleimide or polyfunctional maleimide, the vinyl thermosetting polyphenylene ether and the initiator.

Preferably, the resin composition further comprises a component (D): a flame retardant, which is a bromine-containing flame retardant or/and a phosphorus-containing flame retardant.

In the above resin composition, the flame retardant is a phosphorus-containing flame retardant comprising a DOPO structure, and the molecular formula thereof is as follow:

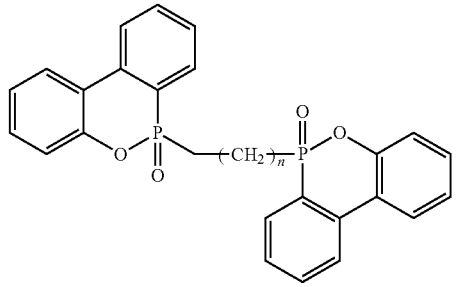

wherein n is an integer of 0 to 10, such as 1, 2, 3, 4, 5, 6, 7, 8 or 9.

Examples of phosphorus-containing flame retardant comprising a DOPO structure include a phosphorus-containing flame retardant XP-7866 from Albemarle, America.

The weight of the flame retardant is 0-40 parts by weight, for example, 3 parts by weight, 6 parts by weight, 9 parts by weight, 12 parts by weight, 15 parts by weight, 18 parts by weight, 21 parts by weight, 24 parts by weight, 27 parts by weight, 30 parts by weight, 33 parts by weight, 36 parts by weight or 39 parts by weight, based on 100 parts by weight of the total weight of the prepolymer of polyolefin resin and bifunctional maleimide or polyfunctional maleimide, the vinyl thermosetting polyphenylene ether and the initiator.

Preferably, the resin composition further comprises a component (E): a filler, which is anyone selected from the group consisting of crystalline silica, amorphous silica, spherical silica, titanium dioxide, silicon carbide, glass fiber, alumina, aluminum nitride, boron nitride, barium titanate and strontium titanate, or a mixture of at least two of them.

The weight of the filler is 0-150 parts by weight, for example, 10 parts by weight, 20 parts by weight, 30 parts by weight, 40 parts by weight, 50 parts by weight, 60 parts by weight, 70 parts by weight, 80 parts by weight, 90 parts by weight, 100 parts by weight, 110 parts by weight, 120 parts by weight, 130 parts by weight or 140 parts by weight, based on 100 parts by weight of the total weight of the prepolymer of polyolefin resin and bifunctional maleimide or polyfunctional maleimide, the vinyl thermosetting polyphenylene ether, the initiator and the flame retardant.

The terms "comprise(s)", "comprising", "include(s)", "including" as used herein mean that, in addition to the described components, other components which impart different properties to the resin composition may be included. In addition, the terms "comprise(s)", "comprising", "include(s)", "including" described in the present invention may also be replaced by closed "is/are" or "consisting of/consist(s) of".

For example, the resin composition may also comprise various additives. Specific examples of the additives include antioxidant, heat stabilizer, antistatic agent, ultraviolet absorber, pigment, colorant, lubricant, and the like. These various additives may be used alone or in a mixture of two or more of them.

Further, the present invention provides a prepreg prepared by using the above resin composition, comprising a substrate and the resin composition as described above which is attached on the substrate after impregnation and drying.

Further, the present invention provides a laminate prepared by using the above resin composition, comprising a plurality of superimposed prepregs.

Further, the present invention provides a copper-clad laminate prepared by using the above resin composition, comprising a plurality of superimposed prepregs and a copper foil overlaying at one side or both sides of the superimposed prepregs.

Further, the present invention provides a printed circuit board prepared by using the above resin composition, comprising a plurality of superimposed prepregs.

The preparation of a high-speed electronic circuit substrate using the above formula comprises the following steps:

(1) Polyolefin resin is subjected to prepolymerization with bifunctional maleimide or polyfunctional maleimide in the presence of a radical initiator, and the conversion ratio of bifunctional maleimide or polyfunctional maleimide is determined by GPC detection and is controlled in the range of 10 to 80%. The weight of the bifunctional maleimide or the polyfunctional maleimide is 10 to 100 parts by weight based on 100 parts by weight of the polyolefin resin;

(2) Components of resin composition are weighed: the weight of the vinyl thermosetting polyphenylene ether is 200-1000 parts by weight, based on 100 parts by weight of the prepolymer of polyolefin resin and bifunctional maleimide or polyfunctional maleimide; the weight of the initiator is 1-3 parts by weight, and the weight of the flame retardant was 0-40 parts by weight, based on 100 parts by weight of the prepolymer of polyolefin resin and bifunctional maleimide or polyfunctional maleimide, the vinyl thermosetting polyphenylene ether and the initiator, and the weight of the filler is 0-150 parts by weight, based on 100 parts by weight of the prepolymer of polyolefin resin and bifunctional maleimide or polyfunctional maleimide, the vinyl thermosetting polyphenylene ether, the initiator and the flame retardant;

(3) The prepolymer of polyolefin resin and bifunctional maleimide or polyfunctional maleimide, the vinyl thermosetting polyphenylene ether, an optional initiator, an optional filler and an optional flame retardant are mixed, and an appropriate amount of a solvent is added, and the mixture is stirred to be dispersed uniformly, so that the filler and flame retardant are evenly dispersed in the glue solution; a fiberglass cloth was impregnated in the prepared glue solution and dried in an oven at a suitable temperature for a certain period of time to remove the solvent to form a prepreg;

(4) Several prepregs are neatly superimposed, and copper foils overlay at the upper and lower surfaces of the superimposed prepregs, and then they are laminated and cured in a press machine to obtain a copper clad laminate.

Compared with the prior art, the present invention has the following beneficial effects:

(1) The present invention solves the problem of incompatibility of bifunctional maleimide or multifunctional maleimide with polyolefin resin and vinyl thermosetting polyphenylene ether by employing the prepolymer of polyolefin resin and bifunctional maleimide or polyfunctional maleimide. The mixed glue solution is uniform, the prepreg has a uniform appearance, and the substrate resin area is free of phase separation;

(2) The maleimide used in the present invention is a bifunctional maleimide or a polyfunctional maleimide, and thus the prepared substrate has higher heat resistance, smaller thermal expansion coefficient, longer thermal stratification time and higher thermal decomposition temperature, compared with a prepared substrate using monofunctional maleimide;

(3) Vinyl thermosetting polyphenylene ether can react with polyolefin resin, bismaleimide or polymaleimide to form a three-dimensional cross-linked network structure, and the prepared high-speed electronic circuit substrate has better heat resistance, such as higher glass transition temperature, smaller thermal expansion coefficient, longer thermal stratification time compared with using thermoplastic polyphenylene ether without vinyl reactive groups;

(4) The present invention uses vinyl thermosetting polyphenylene ether as a matrix resin, a prepolymer of polyolefin resin and bifunctional maleimide or polyfunctional maleimide as a crosslinking agent, and the prepared substrate has better heat resistance compared with a system with a polyolefin resin as a matrix resin.

EMBODIMENTS

Technical solutions of the present invention are further described by the following examples. Raw materials selected for preparing high-speed electronic circuit substrates in examples and comparative examples of the present invention are shown in Table 1 below.

TABLE 1

| Manufacturer | Name or trademark of materials | Description for materials |
| --- | --- | --- |
| Sabic | MX9000 | Methyl methacrylate-modified polyphenylene ether |
| Mitsubishi Chemical | St-PPE-1 | Styryl-modifiedd polyphenylene ether |
| Asahi Kasei | S202A | Thermoplastic polyphenylene ether |
| Wuhan ZHISHENG Science &Technology | Maleimide | Monofunctional maleimide |
| K-I Chemical | Maleimide | Bifunctional maleimide |
| Jinyi Chemical | Maleimide | Trifunctional maleimide |
| Samtomer | R100 | Styrene-butadiene copolymer |
| Nippon Soda | B-1000 | Polybutadiene |
| Samtomer | R250 | Styrene-butadiene-divinylbenzene copolymer |
| Shanghai Gaoqiao Petrochemical Corp. | DCP | Dicumyl peroxide |
| Dongguan XINWEI Chemical Industry | BPO | Dibenzoyl peroxide |
| Sibelco | 525 | Fused silica powder |
| Albemarle, America | BT-93W | Bromine-containing flame retardant |
| Albemarle, America | XP-7866 | Phosphorus-containing flame retardant |
| Shanghai Honghe | 2116 | Glass fiber cloth |

I. Prepolymerization of Polyolefin Resin and Bifunctional Maleimide or Polyfunctional Maleimide 1. Prepolymerization Example 1

25 g of styrene-butadiene copolymer R100 was weighed and dissolved in 25 g of a toluene solvent. 5 g of bifunctional maleimide from K-I Chemical was weighed and dissolved in 20 g of a N,N-dimethylformamide solvent. The solution of styrene-butadiene copolymer R100 and the solution of bifunctional maleimide from K-I chemical were mixed and stirred uniformly. The mixed solution was heated to 120° C., and then 0.1 g of DCP dissolved in 10 g of toluene was added and the mixture was reacted for 1.5 hours. Then the heating was stopped and the mixture was cooled for use.

2. Prepolymerization Example 2

25 g of polybutadiene B-1000 was weighed and dissolved in 25 g of a toluene solvent. 5 g of bifunctional maleimide from K-I Chemical was weighed and dissolved in 20 g of a N,N-dimethylformamide solvent. The solution of styrene-butadiene copolymer R100 and the solution of bifunctional maleimide from K-I Chemical were mixed and stirred uniformly. The mixed solution was heated to 120° C., and then 0.1 g of DCP dissolved in 10 g of toluene was added and the mixture was reacted for 1.5 hours. Then the heating was stopped and the mixture was cooled for use.

3. Prepolymerization Example 3

25 g of styrene-butadiene-divinylbenzene copolymer R250 was weighed and dissolved in 25 g of a toluene solvent. 5 g of bifunctional maleimide from K-I Chemical was weighed and dissolved in 20 g of a N,N-dimethylformamide solvent. The solution of styrene-butadiene copolymer R100 and the solution of bifunctional maleimide from K-I Chemical were mixed and stirred uniformly. The mixed solution was heated to 120° C., and then 0.1 g of DCP dissolved in 10 g of toluene was added and the mixture was reacted for 1.5 hours. Then the heating was stopped and the mixture was cooled for use.

4. Prepolymerization Example 4

25 g of styrene-butadiene copolymer R250 was weighed and dissolved in 25 g of a toluene solvent. 5 g of trifunctional maleimide from Jinyi Chemical was weighed and dissolved in 20 g of a N,N-dimethylformamide solvent. The solution of styrene-butadiene copolymer R100 and the solution of trifunctional maleimide from Jinyi Chemical were mixed and stirred uniformly. The mixed solution was heated to 120° C., and then 0.1 g of DCP dissolved in 10 g of toluene was added and the mixture was reacted for 1.5 hours. Then the heating was stopped and the mixture was cooled for use.

II. Preparation of High-Speed Electronic Circuit Substrates

1. Example 1

A prepolymer prepared by prepolymerization of 25 g parts by weight of styrene-butadiene copolymer R100 and 5 g parts by weight of bifunctional maleimide from KI Chemical, 70 g parts by weight of vinyl thermosetting polyphenylene ether MX9000, 3.0 parts by weight of a curing initiator DCP and 30 g parts by weight of a bromine-containing flame retardant BT-93 W were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 2.

2. Example 2

A prepolymer prepared by prepolymerization of 25 g parts by weight of polybutadiene B-1000 and 5 g parts by weight of bifunctional maleimide from KI Chemical, 70 g parts by weight of vinyl thermosetting polyphenylene ether MX9000, 3.0 parts by weight of a curing initiator DCP, 30 g parts by weight of a bromine-containing flame retardant BT-93 W and 50 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 2.

3. Example 3

A prepolymer prepared by prepolymerization of 25 g parts by weight of styrene-butadiene-divinylbenzene copolymer R250 and 5 g parts by weight of bifunctional maleimide from KI Chemical, 70 g parts by weight of vinyl thermosetting polyphenylene ether MX9000, 3.0 parts by weight of a curing initiator DCP, 30 g parts by weight of a bromine-containing flame retardant BT-93 W and 50 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and a copper foil having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 2.

4. Example 4

A prepolymer prepared by prepolymerization of 25 g parts by weight of styrene-butadiene copolymer R100 and 5 g parts by weight of trifunctional maleimide from Jinyi Chemical, 70 g parts by weight of vinyl thermosetting polyphenylene ether St-PPE-1, 3.0 parts by weight of a curing initiator DCP, 30 g parts by weight of a bromine-containing flame retardant BT-93 W and 50 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 2.

5. Example 5

A prepolymer prepared by prepolymerization of 25 g parts by weight of styrene-butadiene copolymer R100 and 5 g parts by weight of bifunctional maleimide from K-I Chemical, 70 g parts by weight of vinyl thermosetting polyphenylene ether MX9000, 3.0 parts by weight of a curing initiator BPO, 30 g parts by weight of a phosphorus-containing flame retardant XP-7866 and 50 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 2.

6. Example 6

A prepolymer prepared by prepolymerization of 25 g parts by weight of styrene-butadiene copolymer R100 and 2.5 g parts by weight of bifunctional maleimide from K-I Chemical, 55 g parts by weight of vinyl thermosetting polyphenylene ether MX9000, 3.0 parts by weight of a curing initiator DCP, 30 g parts by weight of a bromine-containing flame retardant BT-93 W and 50 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 3.

7. Example 7

A prepolymer prepared by prepolymerization of 25 g parts by weight of styrene-butadiene copolymer R100 and 25 g parts by weight of bifunctional maleimide from K-I Chemical, 100 g parts by weight of vinyl thermosetting polyphenylene ether MX9000, 3.0 parts by weight of a curing initiator DCP, 30 g parts by weight of a bromine-containing flame retardant BT-93 W and 50 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 3.

8. Example 8

A prepolymer prepared by prepolymerization of 25 g parts by weight of styrene-butadiene copolymer R100 and 2.5 g parts by weight of bifunctional maleimide from K-I Chemical, 275 g parts by weight of vinyl thermosetting polyphenylene ether St-PPE-1, 3.0 parts by weight of a curing initiator DCP, 60 g parts by weight of a bromine-containing flame retardant BT-93 W and 100 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 3.

9. Example 9

A prepolymer prepared by prepolymerization of 25 g parts by weight of styrene-butadiene copolymer R100 and 25 g parts by weight of bifunctional maleimide from K-I Chemical, 500 g parts by weight of vinyl thermosetting polyphenylene ether St-PPE-1, 3.0 parts by weight of a curing initiator DCP, 90 g parts by weight of a bromine-containing flame retardant BT-93 W and 150 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 3.

10. Comparative Example 1

70 g parts by weight of vinyl thermosetting polyphenylene ether MX9000 dissolved in toluene, 5 g parts by weight of bifunctional maleimide from KI Chemical dissolved in N,N-dimethylformamide, 25 g parts by weight of butadiene-styrene copolymer R100, 3.0 parts by weight of a curing initiator DCP, 30 g parts by weight of a bromine-containing flame retardant BT-93 W and 50 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 4.

11. Comparative Example 2

70 g parts by weight of vinyl thermosetting polyphenylene ether MX9000 dissolved in toluene, 5 g parts by weight of monofunctional maleimide from Wuhan ZHISHENG Science & Technology dissolved in N,N-dimethylformamide, 25 g parts by weight of butadiene-styrene copolymer R100, 3.0 parts by weight of a curing initiator DCP, 30 g parts by weight of a bromine-containing flame retardant BT-93 W and 50 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 4.

12. Comparative Example 3

70 g parts by weight of vinyl thermoplastic polyphenylene ether S202A dissolved in toluene, 25 g parts by weight of butadiene polymer B-1000 dissolved in toluene and 5 g parts by weight of bifunctional maleimide from K-I Chemical dissolved in N,N-dimethylformamide were mixed and stirred uniformly. The mixed solution was heated to 120° C., and then 0.1 g of DCP dissolved in toluene was added and the mixture was reacted for 1.5 hours. Then the heating was stopped and the mixture was cooled for use.

The above-mentioned semi-IPN type composite thermosetting resin composition, 3.0 parts by weight of a curing initiator DCP, 30 g parts by weight of a bromine-containing flame retardant BT-93 W and 50 g of fused silica powder 525 were dissolved in a toluene solvent and adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 4.

13. Comparative Example 4

A prepolymer prepared by prepolymerization of 70 g parts by weight of styrene-butadiene copolymer R100 and 5 g parts by weight of bifunctional maleimide from K-I Chemical, 25 g parts by weight of vinyl thermosetting polyphenylene ether MX9000, 3.0 parts by weight of a curing initiator DCP, 30 g parts by weight of a bromine-containing flame retardant BT-93 W and 50 g of fused silica powder 525 were dissolved in a toluene solvent and the solution was adjusted to a suitable viscosity. A 2116 fiberglass cloth was impregnated in the resulting glue and was controlled to a suitable weight by a clamp shaft, and was dried in an oven to remove the toluene solvent, and then a 2116 bonding sheet was obtained. Four 2116 bonding sheets were superimposed, and copper foils having a thickness of 1 OZ overlaid at the upper and lower surfaces of the superimposed bonding sheets, and then they were laminated and cured in a press machine in vacuum for 90 min with a curing pressure of 50 kg/cm$^2$ and a curing temperature of 200° C. to obtain a high-speed electronic circuit substrate. Physical properties thereof are shown in Table 4.

TABLE 2

| Raw materials and Properties | Example 1 | Example 2 | Example 3 | Example 4 | Example 5 |
|---|---|---|---|---|---|
| MX9000 | 70 | 70 | 70 | 0 | 70 |
| St-PPE-1 | 0 | 0 | 0 | 70 | 0 |
| S202A | 0 | 0 | 0 | 0 | 0 |
| R100 | 25 | 0 | 0 | 25 | 25 |
| B-1000 | 0 | 25 | 0 | 0 | 0 |
| R250 | | | 25 | 0 | 0 |
| Monofunctional maleimide | 0 | 0 | 0 | 0 | 0 |
| Bifunctional maleimide | 5 | 5 | 5 | 0 | 5 |
| Trifunctional maleimide | 0 | 0 | 0 | 5 | 0 |
| DCP | 3 | 3 | 3 | 3 | 0 |
| BPO | 0 | 0 | 0 | 0 | 3 |
| BT-93W | 30 | 30 | 30 | 0 | 0 |
| XP-7866 | 0 | 0 | 0 | 30 | 30 |
| 525 | 50 | 50 | 50 | 50 | 50 |

TABLE 2-continued

| Raw materials and Properties | Example 1 | Example 2 | Example 3 | Example 4 | Example 5 |
|---|---|---|---|---|---|
| Glass transition temperature (° C.) | 210.0 | 210.0 | 210.0 | 220.0 | 210.0 |
| Thermal decomposition temperature (° C.) | 420.0 | 420.0 | 420.0 | 430.0 | 440.0 |
| Thermal stratification time T288 | >60 min | >60 min | >60 min | >120 min | >60 min |
| Thermal expansion coefficient 50-260° C. | 1.8% | 1.8% | 1.8% | 1.8% | 1.8% |
| Flame retardancy | Grade V-0 | Grade V-0 | Grade V-0 | Grade V-0 | Grade V-0 |
| Dielectric constant (10 GHz) | 3.90 | 3.90 | 3.90 | 3.90 | 3.90 |
| Dielectric loss tangent (10 GHz) | 0.0048 | 0.0048 | 0.0048 | 0.0048 | 0.0048 |
| Appearance of prepreg | Good appearance No crack | Good appearance No crack | Good appearance No crack | Good appearance No crack | Good appearance No crack |
| Whether the substrate resin area has a phase separation | No phase separation | No phase separation | No phase separation | No phase separation | No phase separation |
| Whether delamination occurs to a 28 layers of PCB after lead-free reflow soldering | No | / | / | / | / |

TABLE 3

| Raw materials and Properties | Example 6 | Example 7 | Example 8 | Example 9 |
|---|---|---|---|---|
| MX9000 | 55 | 100 | 0 | 0 |
| St-PPE-1 | 0 | 0 | 275 | 500 |
| S202A | 0 | 0 | 0 | 0 |
| R100 | 25 | 25 | 25 | 25 |
| B-1000 | 0 | 0 | 0 | 0 |
| R250 | 0 | 0 | 0 | 0 |
| Monofunctional maleimide | 0 | 0 | 0 | 0 |
| Bifunctional maleimide | 2.5 | 25 | 2.5 | 25 |
| Trifunctional maleimide | 0 | 0 | 0 | 0 |
| DCP | 3 | 3 | 3 | 3 |
| BPO | 0 | 0 | 0 | 0 |
| BT-93W | 30 | 30 | 60 | 90 |
| XP-7866 | 0 | 0 | 0 | 0 |
| 525 | 52 | 50 | 100 | 150 |
| Glass transition temperature (° C.) | 200.0 | 220.0 | 190.0 | 200.0 |
| Thermal decomposition temperature (° C.) | 400.0 | 410.0 | 400.0 | 420.0 |
| Thermal stratification time T288 | >60 min | >60 min | >60 min | >60 min |
| Thermal expansion coefficient 50-260° C. | 2.0% | 1.8% | 2.3% | 2.0% |
| Flame retardancy | Grade V-0 | Grade V-0 | Grade V-0 | Grade V-0 |
| Dielectric constant (10 GHz) | 3.70 | 4.00 | 4.10 | 4.20 |
| Dielectric loss tangent (10 GHz) | 0.0045 | 0.0052 | 0.0060 | 0.0065 |
| Appearance of prepreg | Good appearance No crack | Good appearance No crack | Good appearance No crack | Good appearance No crack |
| Whether the substrate resin area has a phase separation | No phase separation | No phase separation | No phase separation | No phase separation |
| Whether delamination occurs to a 28 layers of PCB after lead-free reflow soldering | / | / | / | / |

TABLE 4

| Raw materials and Properties | Comparative Exampe 1 | Comparative Exampe 2 | Comparative Exampe 3 | Comparative Exampe 4 |
|---|---|---|---|---|
| MX9000 | 70 | 70 | 0 | 25 |
| St-PPE-1 | 0 | 0 | 0 | 0 |

TABLE 4-continued

| Raw materials and Properties | Comparative Exampe 1 | Comparative Exampe 2 | Comparative Exampe 3 | Comparative Exampe 4 |
|---|---|---|---|---|
| S202A | 0 | 0 | 70 | 0 |
| R100 | 25 | 25 | 0 | 70 |
| B-1000 | 0 | 0 | 25 | 0 |
| R250 | 0 | 0 | 0 | 0 |
| Monofunctional maleimide | 0 | 5 | 0 | 0 |
| Bifunctional maleimide | 5 | 0 | 5 | 5 |
| Trifunctional maleimide | 0 | 0 | 0 | 0 |
| DCP | 3 | 3 | 3 | 3 |
| BPO | 0 | 0 | 0 | 0 |
| BT-93W | 30 | 30 | 30 | 30 |
| XP-7866 | 0 | 0 | 0 | 0 |
| 525 | 50 | 50 | 50 | 50 |
| Glass transition temperature (° C.) | 210.0 | 190.0 | 180.0 | 200.0 |
| Thermal decomposition temperature (° C.) | 420.0 | 390.0 | 400.0 | 390.0 |
| Thermal stratification time T288 | >60 min | <60 min | <60 min | <60 min |
| Thermal expansion coefficient 50-260° C. | 1.8% | 2.7% | 3.0% | 3.0% |
| Flame retardancy | Grade V-0 | Grade V-0 | Grade V-0 | Grade V-0 |
| Dielectric constant (10 GHz) | 3.90 | 3.90 | 3.90 | 3.70 |
| Dielectric loss tangent (10 GHz) | 0.0048 | 0.0048 | 0.0048 | 0.0045 |
| Appearance of prepreg | Poor appearance with cracks | Poor appearance with cracks | Poor appearance with stripes, colloidal particles and dry flowers | Good appearance No crack |
| Whether the substrate resin area has a phase separation | Phase separation occurs | Phase separation occurs | Microphase phase separation | No phase separation |
| Whether delamination occurs to a 28 layers of PCB after lead-free reflow soldering | / | / | Yes | Yes |

Physical Properties Analysis:

As can be seen from Table 2 and Table 3, by prepolymerization of polyolefin resin and bifunctional maleimide or polyfunctional maleimide, the problem of incompatibility of vinyl thermosetting polyphenylene ether, polyolefin resin and maleimide is solved; the prepared prepreg has a good appearance and there is no phase separation in the substrate resin area. Cross-linking and curing can occur among polyolefin resin, vinyl thermosetting polyphenylene ether and maleimide, forming a three-dimensional network structure having a high cross-linking density. The use of vinyl thermosetting polyphenylene ether as the main resin ensures that the prepared electronic circuit substrate has excellent heat resistance. The prepared substrate has excellent comprehensive properties such as excellent dielectric properties and heat resistance, and is perfectly suitable for use as a substrate in high speed electronic circuit PCB.

As can be seen from Comparative Example 1, when styrene-butadiene copolymer and bifunctional maleimide are not subjected to prepolymerization, the prepreg has a poor appearance with defect of cracks, and there is a phase separation in the substrate resin area.

As can be seen from Comparative Example 2, when monofunctional maleimide is used and is not prepolymerized with styrene-butadiene copolymer, the prepreg has a poor appearance with defect of cracks, and there is a phase separation in the substrate resin area. In addition, heat resistance of the product is inferior (glass transition temperature is lower, thermal decomposition temperature is lower, thermal stratification time is shorter, and thermal expansion coefficient is larger) than that of a product prepared by using bifunctional maleimide.

As can be seen from Comparative Example 3, the electronic circuit substrate prepared using thermoplastic polyphenylene ether and polybutadiene by a compatibilization process has an insufficient heat resistance (lower glass transition temperature, lower heat decomposition temperature, shorter thermal stratification time, higher thermal expansion coefficient), and thus the prepared PCB used for high multi-layer high-speed electronic circuit has a significant heat resistance problem that delamination will occur after several harsh lead-free reflow solderings. Moreover, since the thermoplastic polyphenylene ether has a high molecular weight, the prepared prepreg has an appearance with defects of stripes, colloidal particles, dry flowers, and there is a phase separation in the substrate resin area.

As can be seen from Comparative Example 4, when polyolefin resin (styrene-butadiene copolymer in this example) rather than polyphenylene ether is used as the main resin, the prepared electronic circuit substrate has an insufficient heat resistance (lower glass transition temperature, lower heat decomposition temperature, shorter thermal stratification time, higher thermal expansion coefficient), and thus the prepared PCB used for high multi-layer high-speed electronic circuit has a significant heat resistance problem that delamination will occur after several harsh lead-free reflow solderings.

The examples of the present invention are described above and they are not intended to limit the present invention. Any changes and modifications made to the present invention according to the technical concept of the present invention fall within the protection scope of the present invention.

The applicant states that: the present application describes detailed means of the present invention by the aforesaid examples, but the present invention is not limited to the aforesaid detailed means. That is to say, it does not mean that the present invention cannot be fulfilled unless relying on the aforesaid detailed means. Those skilled in the art shall know that, any modification to the present invention, any equivalence replacement of each raw material of the product of the present invention and the addition of auxiliary ingredient, the selection of specific embodiment and the like all fall into the protection scope and the disclosure scope of the present invention.

The invention claimed is:

1. A resin composition, comprising:
   (A) a prepolymer of polyolefin resin and bifunctional maleimide or polyfunctional maleimide; wherein the weight of bifunctional maleimide or polyfunctional maleimide is 10 to 100 parts by weight based on 100 parts by weight of polyolefin resin; the conversion ratio of bifunctional maleimide or polyfunctional maleimide is controlled in the range of 10-80%; and
   (B) a vinyl thermosetting polyphenylene ether;
   wherein, based on 100 parts by weight of the prepolymer of polyolefin resin and bifunctional maleimide or polyfunctional maleimide, the weight of the vinyl thermosetting polyphenylene ether is 200 to 1000 parts by weight.

2. The resin composition of claim 1, wherein the polyolefin resin comprises at least one member selected from the group consisting of a styrene-butadiene copolymer, a polybutadiene copolymer, and styrene-butadiene-divinylbenzene copolymer.

3. The resin composition of claim 1, wherein the polyolefin resin comprises at least one member selected from the group consisting of amino-modified, maleic anhydride-modified, epoxy-modified, acrylate-modified, hydroxy-modified or carboxy-modified styrene-butadiene copolymer, polybutadiene and styrene-butadiene-divinylbenzene copolymer.

4. The resin composition of claim 1, wherein the weight of bifunctional maleimide or polyfunctional maleimide is 10 to 100 parts by weight based on 100 parts by weight of polyolefin resin.

5. The resin composition of claim 1, wherein the bifunctional maleimide or polyfunctional maleimide has a structure:

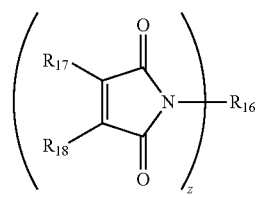

wherein $R_{16}$ is an aliphatic or aromatic organic group having a valence of z;

$R_{17}$ and $R_{18}$ are independently anyone selected from the group consisting of hydrogen atom, halogen atom, substituted or unsubstituted C1-C8 linear alkyl group, and substituted or unsubstituted C1-C8 branched alkyl group; and z represents an integer greater than or equal to 2.

6. The resin composition of claim 1, wherein the bifunctional maleimide is

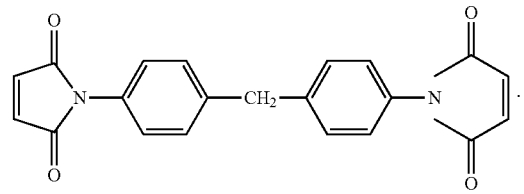

7. The resin composition of claim 1, wherein the polyfunctional maleimide is

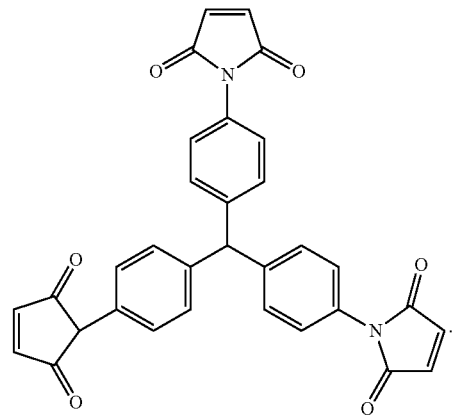 [SMILES: O=C1C=CC(=O)C1c1ccc(C(c2ccc(N3C(=O)C=CC3=O)cc2)c2ccc(N3C(=O)C=CC3=O)cc2)cc1]

8. The resin composition of claim 1, wherein the vinyl thermosetting polyphenylene ether has a structural formula represented by the following formula (1):

$$Z\text{-}(O\text{-}Y\text{-})_a\text{-}(O\text{-}X\text{-}O\text{-})\text{-}(Y\text{-}O\text{-})_b Z \qquad (1)$$

in formula (1), a and b are independently an integer of 1 to 30; Z has a structure of formula (2) or (3); —(O—Y—)— has a structure of formula (4); and —(—O—X—O—)— has a structure of formula (5):

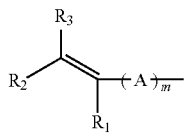

(3)

wherein in formula (3), A is arylene group, carbonyl group, or alkylene group having 1 to 10 carbon atoms; m is an integer of 0 to 10; $R_1$, $R_2$ and $R_3$ are each independently hydrogen or alkyl group having 10 or less carbon atoms;

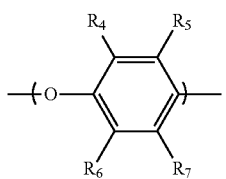

(4)

in formula (4), $R_4$ and $R_6$ are each independently hydrogen atom, halogen atom, alkyl group having 8 or less carbon atoms or phenyl group having 8 or less carbon atoms; $R_5$ and R7 are each independently hydrogen atom, halogen atom, alkyl group having 8 or less carbon atoms or phenyl group having 8 or less carbon atoms;

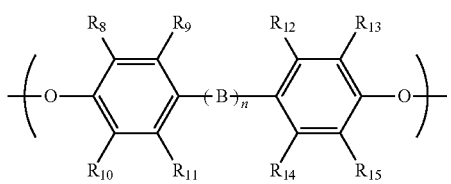

(5)

in formula (5), $R_8$, $R_9$, $R_{10}$, $R_{11}$, $R_{12}$, $R_{13}$, $R_{14}$ and $R_{15}$ are each independently hydrogen atom, halogen atom, alkyl group having 8 or less carbon atoms or phenyl group having 8 or less carbon atoms; B is hydrocarbylene group, —O—, —CO—, —SO—, —SC—, —SO$_2$— or —C(CH$_3$)$_2$—; and n is 0 or 1.

9. The resin composition of claim 1, wherein the vinyl thermosetting polyphenylene ether has a number average molecular weight from 500 to 10,000 g/mol.

10. The resin composition of claim 1, further comprising an initiator.

11. The resin composition of claim 10, wherein the initiator is a radical initiator that is an organic peroxide initiator.

12. The resin composition of claim 11, wherein the radical initiator comprises at least one member selected from the group consisting of dilauroyl peroxide, dibenzoyl peroxide, cumyl peroxyneodecanoate, tert-butyl peroxyneodecanoate, tert-amyl peroxypivalate, tert-butyl peroxypivalate, tert-butyl peroxyisobutyrate, tert-butyl peroxy-3,5,5-trimethylhexanoate, tert-butyl peroxyacetate, tert-butyl peroxybenzoate, 1,1-di-(tert-butylperoxy)-3,5,5-trimethylcyclohexane, 1,1-di(tert-butylperoxy)cyclohexane, 2,2-di(tert-butylperoxy)butane, bis(4-tert-butylcyclohexyl)peroxydicarbonate, cetyl peroxydicarbonate, tetradecyl peroxydicarbonate, di-tert amyl peroxide, dicumyl peroxide, bis(tert-butylperoxy-isopropyl)benzene, 2,5-dimethyl-2,5-di(tert-butylperoxy) hexane, 2,5-dimethyl-2,5-di(tert-butylperoxy)hexyne, diisopropylbenzene hydroperoxide, isopropylbenzene hydroperoxide, tert-amyl hydroperoxide, tert-butyl hydroperoxide, tert-butyl cumyl peroxide, diisopropylbenzene hydroperoxide, peroxy carbonate-tert-butyl 2-ethylhexanoate, tert-butyl peroxy 2-ethylhexyl carbonate, n-butyl 4,4-di (tert-butylperoxy)valerate, methyl ethyl ketone peroxide and cyclohexane peroxide.

13. The resin composition of claim 10, wherein the weight of the initiator is 1-3 parts by weight, based on 100 parts by weight of the total weight of the prepolymer of polyolefin resin and bifunctional maleimide or polyfunctional maleimide, the vinyl thermosetting polyphenylene ether and the initiator.

14. The resin composition of claim 1, further comprising a flame retardant.

15. The resin composition of claim 14, wherein the flame retardant is at least one member selected from the group consisting of a bromine-containing flame retardant and a phosphorus-containing flame retardant.

16. The resin composition of claim 14, wherein the flame retardant is a phosphorus-containing flame retardant comprising a DOPO structure, and has a molecular formula of

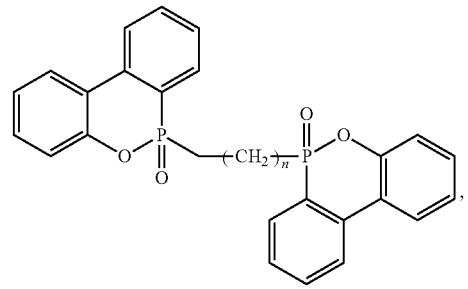

wherein n is an integer of 0 to 10.

17. The resin composition of claim 14, wherein the weight of the flame retardant is 0-40 parts by weight, based on 100 parts by weight of the total weight of the prepolymer of polyolefin resin and bifunctional maleimide or polyfunctional maleimide, the vinyl thermosetting polyphenylene ether and the initiator.

18. The resin composition of claim 1, wherein the resin composition further comprises a filler; and
wherein the filler is at least one member selected from the group consisting of crystalline silica, amorphous silica, spherical silica, titanium dioxide, silicon carbide, glass fiber, alumina, aluminum nitride, boron nitride, barium titanate and strontium titanate.

19. The resin composition of claim 18, wherein the weight of the filler is 0-150 parts by weight, based on 100 parts by weight of the total weight of the prepolymer of polyolefin resin and bifunctional maleimide or polyfunctional maleimide, the vinyl thermosetting polyphenylene ether, the initiator and the flame retardant.

20. A prepreg comprising a substrate and the resin composition of claim 1 which is attached on the substrate after impregnation and drying.

21. A laminate comprising at least one superimposed prepreg of claim 20.

* * * * *